United States Patent [19]
Michel

[11] Patent Number: 5,124,593
[45] Date of Patent: Jun. 23, 1992

[54] CONTINUOUS-TIME FILTER TUNING CIRCUIT AND METHOD

[75] Inventor: Jean-Yves Michel, Santa Clara, Calif.

[73] Assignee: National Semiconductor Corporation, Santa Clara, Calif.

[21] Appl. No.: 588,201

[22] Filed: Sep. 26, 1990

[51] Int. Cl.$^5$ .......................... H03B 1/00; H03K 5/00
[52] U.S. Cl. .................... 307/521; 328/167; 307/491
[58] Field of Search ........ 307/520, 521, 491; 328/164, 167, 141, 151; 330/9, 107, 109; 333/173

[56] References Cited

U.S. PATENT DOCUMENTS

| | | | |
|---|---|---|---|
| 4,045,731 | 8/1977 | Tokunou et al. | 330/109 |
| 4,066,976 | 1/1978 | Dickopp et al. | 330/109 |
| 4,691,171 | 9/1987 | Van Roermund et al. | 307/521 |
| 4,733,205 | 3/1988 | Hughes | 333/173 |

*Primary Examiner*—Timothy P. Callahan
*Attorney, Agent, or Firm*—Limbach & Limbach

[57] ABSTRACT

A tuning circuit for tuning an integrated circuit filter, such as a continuous-time MOSFET-C filter, is disclosed. The tuning circuit includes a switched-capacitor network having a capacitor which matches the capacitor used in the filter to be tuned. Also included is a transistor which matches the transistor used in the filter. The switched-capacitor network has a effective resistance which is a function of the switching rate of the network. Feedback circuitry is included which produces a control signal used to vary the small signal resistance of the transistor to match the effective resistance of the switched-capacitor network. The filter is tuned by varying the rate of which the switched capacitor network is clocked thereby changing to effective network resistance. The control voltage responds by forcing the transistor resistance to match the new effective resistance of the switched-capacitor network. The control voltage is used to tune the filter and changes to compensate for variations in the filter capacitor and transistor, which track variations in the filter transistor and capacitor.

20 Claims, 3 Drawing Sheets

CONTINUOUS-TIME FILTER TUNING CIRCUIT AND METHOD

BACKGROUND OF THE INVENTION

1. Field of the Invention

The present invention relates generally to filter circuits and more particularly to a tuning circuit for tuning continuous-time MOSFET-C filters.

2. Background Art

Continuous-time MOSFET-C filters have recently come into use. The expression continuous-time is used to distinguish the filter from other types of filters which use data sampling techniques such as switched-capacitor filtering. Continuous-time filters possess many advantages over other types of filters such as switched-capacitor and other types of sampled-data filters. However, the frequency response of continuous-time MOSFET-C filters is sensitive to fabrication process tolerances, operating temperature variations and aging.

One solution to this problem is to employ an on-chip automatic tuning circuit which provides indirect tuning of the continuous-time filter. In addition to the main continuous-time filter, the integrated circuit includes a tuning circuit. Typically, the characteristics of the tuning circuit are comparable to that of the filter so that characteristics of the tuning circuit and filter will track one another.

An exemplary conventional tuning circuit may include an on-chip resistor in the form of an MOS transistor, with the MOS transistor having the same characteristics as the MOS transistor which make up the filter circuit. The tuning circuit includes a comparison circuit which compares the resistance of the on-chip resistor formed by the MOS transistor with an external resistor. The external resistor is a highly quality resistor selected to have a low temperature coefficient. In the event of a mismatch between the two resistances, the comparison circuit will produce a control voltage which changes the MOS transistor resistance.

The control voltage produced by the tuning circuit is used to tune the associated continuous-time filter. The MOS transistors which form the continuous-time filters are ratio matched, in terms of width W and length L, to the MOS transistor of the tuning circuit. Accordingly, the various functions which would effect the MOS transistors of the filter, including fabrication process tolerances, operating temperature variations, aging and the like will also effect the MOS transistor of the tuning circuit so that the effects tend to be cancelled.

Capacitor values used in continuous-time MOSFET-C filter cannot be accurately controlled during fabrication. Accordingly, such continuous filters which utilize external reference resistors require that the filter be initially tuned externally. In addition, this approach does not compensate for large changes in filter capacitances.

If the use of an external resistance is not acceptable, it is possible to automatically tune RC products rather than just resistance values. This is accomplished utilizing an external accurate clock signal or an accurate on-chip clock if one is available. A reference circuit is produced on the basic structures as the main filter. The reference circuit can be a duplicate of the filter or a replica of one basic cell of the filter. A phase comparator compares the phase of the reference "filter" output with that of the clock. The comparator outputs a control voltage which adjusts the reference "filter" so that the phase difference is at a predetermined value. This causes the RC products within the reference filter to attain fixed, predetermined values.

The resistors and capacitors of the filter are ratio-matched to those of the reference circuit so that the RC products within the reference circuit are also stabilized, as is the frequency response characteristics of the filter. This approach automatically corrects for variations of both resistances and capacitances and requires no initial adjustment of the frequency response.

A variation of the foregoing tuning circuit could include a voltage controlled oscillator as the reference circuit. The oscillator is constructed from the same basic structures as the filter. The phase comparator compares the output of the oscillator with the clock and produces a control voltage which cause the oscillator output to track the clock. The RC products of the oscillator and filter are stabilized by the control voltage as is the frequency response of the filter.

The foregoing techniques for indirect tuning of continuous filter all process significant shortcomings. Tuning circuits, as described, which utilize external reference resistors require initial adjustments and do not compensate adequately for changes in both R and C values. Tuning circuits, as described, with external clocks, require that the clock frequency be outside the passband of the filter. Further, if the external clock reference circuit is a phase comparator, an offset in the comparator will result in a frequency tuning error. If the external clock reference circuit is a voltage controlled oscillator, the filter will not be suitable for high frequency applications since is generally difficult to build high frequency voltage controlled oscillators that are well matched to the associated filter. Further, harmonic distortion and transconductance non-linearity may shift the frequency of the oscillator unless the amplitude of the oscillator output is carefully regulated.

A still further approach for indirect automatic tuning utilizes an integrator as a reference circuit. A reference input in the form of a sine wave is applied to the input of the integrator. The output of the integrator and the input reference are both rectified and compared using a comparison circuit. The comparator produces a control voltage which changes the gain of the integrator until the magnitude of the rectified output of the integrator matches the magnitude of the rectified reference input.

The integrator is fabricated utilizing transistors and capacitors which match the transistors and capacitors of the filter. The feedback element of the integrator is a capacitor and the input element is a resistor in the form of a MOS transistor. The control voltage is applied to the gate electrode of the transistor thereby changing the gain of the integrator.

The principal disadvantage of the gain controlled integrator tuning circuit is that a relatively large number of building blocks are required. Further, the circuitry is somewhat complicated to implement in integrated circuit form.

The present invention is an indirect tuning circuit which possess the advantages of the previously-described conventional tuning circuit which utilizes a gain controlled integrators. However, the disclosed tuning circuit can be easily implemented in integrated circuit form and requires a relatively small number of building blocks. These and other advantages of the present invention will be apparent to those skilled in the art upon reading the following Detailed Description of the Invention together with the drawings.

SUMMARY OF THE INVENTION

Apparatus and method for tuning a monolithic integrated circuit filter, such as a continuous-time MOSFET-C filter, are disclosed. The filter includes at least one transistor and one capacitor. The tuning apparatus includes first resistance means for producing an effective first resistance which is a function of a capacitor located in the integrated circuit. Preferably, the first resistance means includes a switched-capacitor network which is clocked at a variable rate and has a capacitor which matches the capacitor of the filter.

The tuning apparatus further includes a second resistance means for providing an effective second resistance which is a function of the resistance of a tuning circuit transistor located in the integrated circuit. The transistor is preferably a MOS transistor which matches the transistor of the filter.

Control means are included in the tuning apparatus for providing the control signal used to tune the filter. The control signal is a function of the ratio of the first and second resistances, which is preferably unity.

The filter is preferably tuned by varying the frequency of the clock supplied to the switched-capacitor network which causes the effective first resistance to change. The control means responds by altering the control signal, which preferably causes the effective second resistance to change. The change in the control signal causes the frequency response characteristics of the filter circuit to change. In the event the filter transistor and capacitor change due to temperature, aging and the like, such changes will be reflected in the tuning circuit, which will adjust the magnitude of the control signal so as to compensate for such changes.

DETAILED DESCRIPTION OF THE INVENTION

Figure 1:
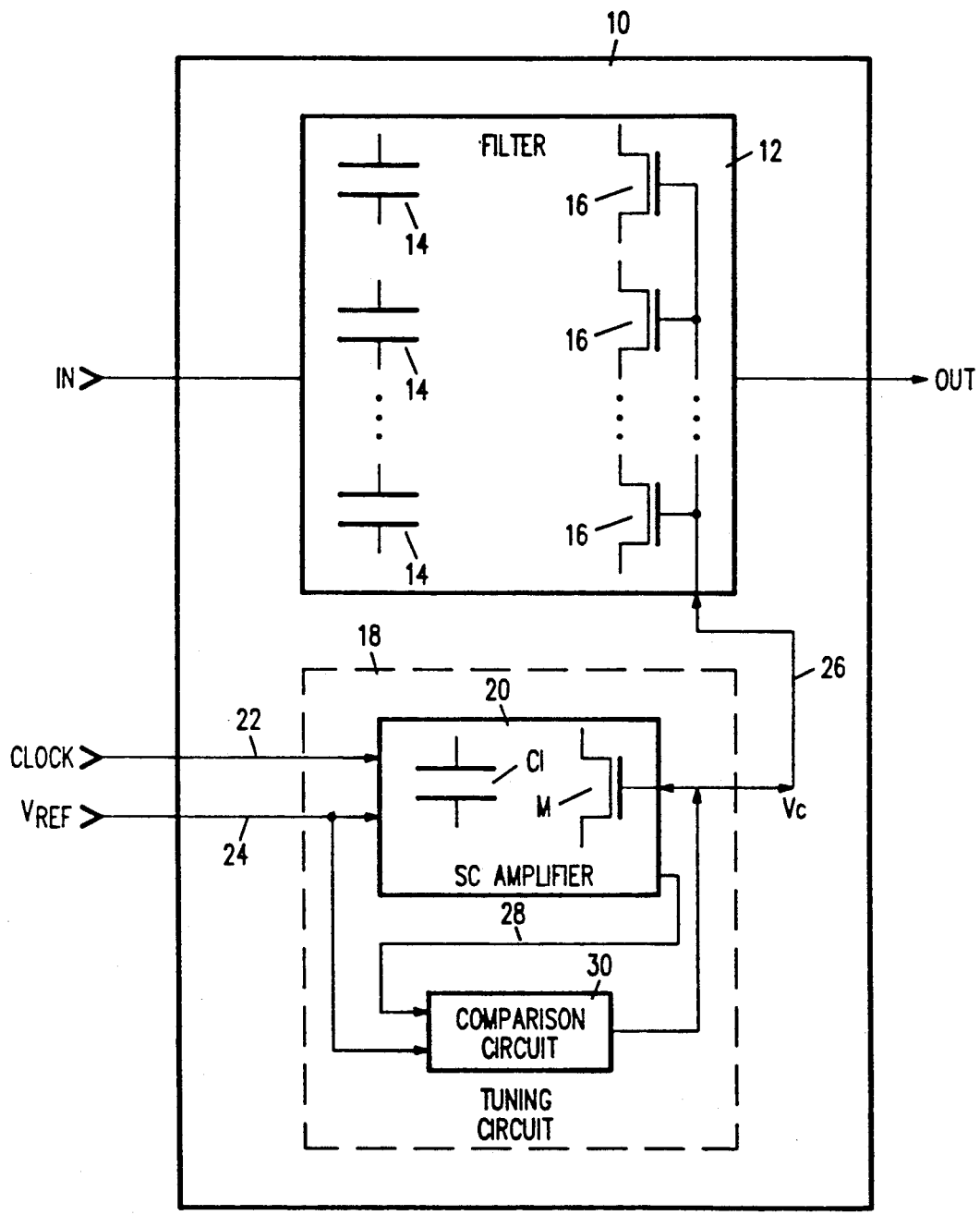
FIG. 1 is a simplified block diagram of a monolithic integrated circuit continuous-time filter and associated tuning circuit in accordance with the present invention.

Referring to the block diagram of FIG. 1, the monolithic integrated circuit filter includes a conventional continuous-time filter represented by block 12. Such filters are derived from classical RC active filters and use MOS field-effect transistors (MOSFETs) 16, capacitors 14 and active elements (not depicted). Such filters are frequently referred to as continuous-time MOSFET-C filters or variations thereof. The particular implementation of filter 12 forms no part of the present invention.

Filter 12 is tuned by applying a control voltage $V_c$ to the gate electrodes of transistors 16 by way of line 26. The control voltage is produced by a tuning circuit 18, in accordance with the present invention, which is fabricated on the same chip as filter 12.

Tuning circuit 18 includes a switched-capacitor amplifier (SC amplifier) 20 which receives a clock signal on line 22 and a D.C. voltage reference $V_{REF}$ on line 24. SC amplifier 20 is fabricated utilizing one or more capacitors, represented by capacitor $C_I$ and one or more MOS transistors, represented by transistor M.

Capacitor $C_I$ and transistor M are fabricated to match the characteristics of capacitors 14 and transistors 16 of filter 12, as is done in conventional indirect automatic tuning applications. Tuning circuit 18 further includes a comparison circuit 30 which compares an output of amplifier 20 on line 28 with reference voltage $V_{REF}$ on line 24.

As will be subsequently described in greater detail, SC amplifier 20 has a voltage gain which is a function of both the value of capacitor $C_I$ and the ON resistance of transistor M. Assuming that the voltage gain of amplifier 20 is unity, the magnitude of the D.C. output of the amplifier on line 28 should be equal to the magnitude of the reference voltage $V_{REF}$.

Comparison circuit 30 will produce a control voltage $V_c$ which is a function of the difference between the amplifier 20 output voltage and $V_{REF}$. Any difference in magnitude will cause a change in voltage $V_c$ which is connected to the gate electrode of transistor M. The change in gate voltage will change the ON resistance of the transistor, which will cause the voltage gain of the amplifier to return to unity.

The gain of SC amplifier 20 will change with changes in capacitor $C_I$ and transistor M, therefore the control voltage $V_c$ can be used to stabilize the response of filter 12 which is constructed utilizing similar components. Since amplifier 20 is basically a D.C. amplifier and since the reference voltage $V_{REF}$ is a D.C. voltage, complex rectifier circuits are not required as in conventional gain-control implementation of automatic indirect tuning circuits.

Figure 2:
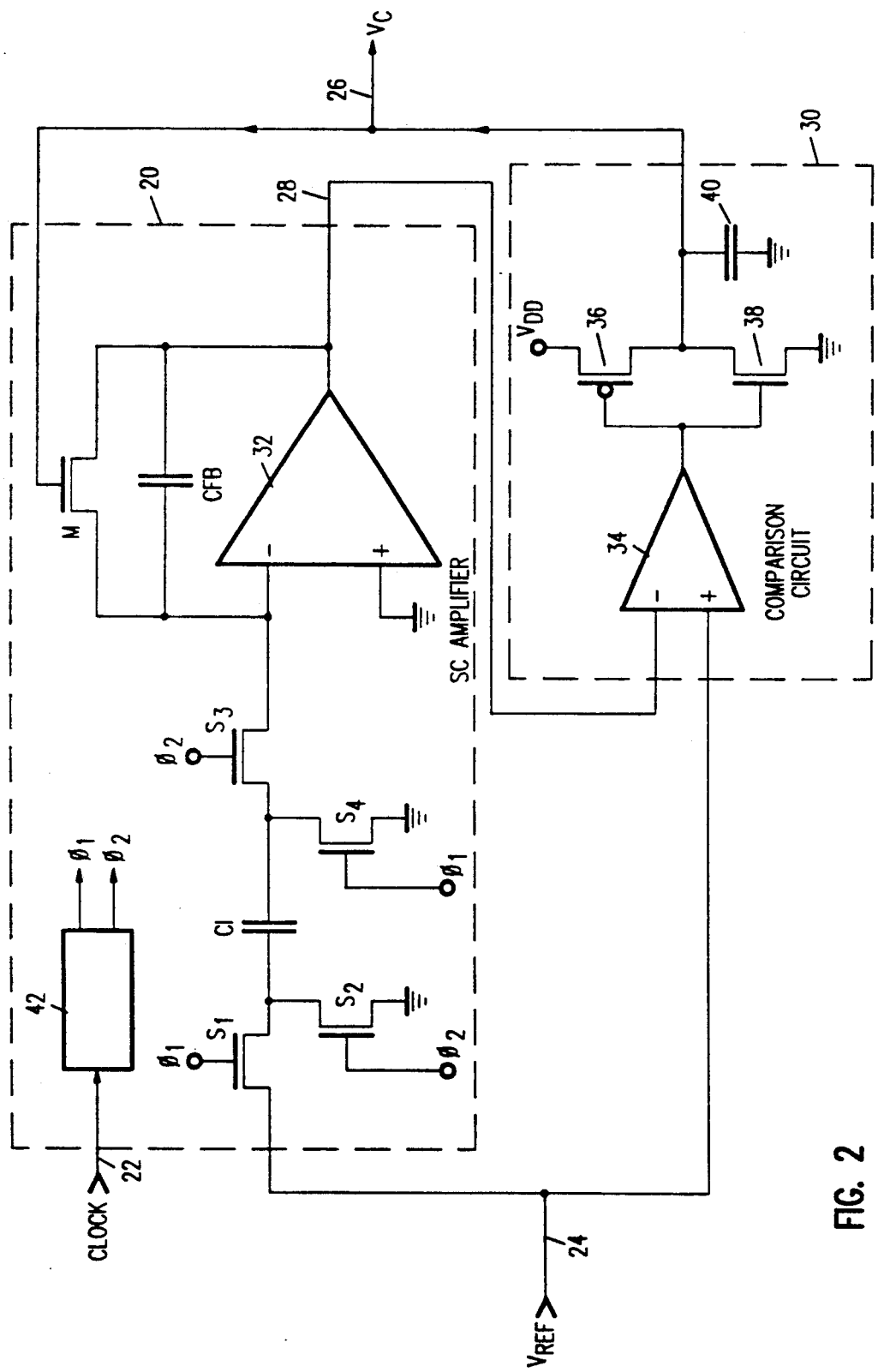
FIG. 2 is a detailed schematic diagram of the tuning circuit of FIG. 1.

FIG. 2 shows the details of the construction of one embodiment of the tuning circuit 18. The circuit includes an operational amplifier 32 having a grounded non-inverting input. The source electrode of a MOS transistor M is connected to the inverting input of amplifier 32 and the drain electrode is connected to the amplifier output. A feedback capacitor $C_{FB}$ is also connected between the inverting input and the output of the amplifier.

A switched-capacitor network made up of transistor switches $S_1$, $S_2$, $S_3$, and $S_4$ and capacitor $C_I$ is coupled between the inverting input of amplifier 32 and the voltage reference $V_{REF}$ on line 24. Switch $S_1$ is connected between a first terminal of capacitor $C_I$ and the reference voltage and switch $S_2$ is connected between the first capacitor terminal and ground. Switch $S_3$ is connected between the second terminal of capacitor $C_I$ and the inverting input of amplifier 32. Switch $S_4$ is connected between the second capacitor terminal and ground.

A biphase clock generator 42 is driven by the clock signal on line 22 of frequency $f_s$. Generator 42 produces two non-overlapping clocks $\phi_1$ and $\phi_2$, each having the same frequency as the input clock $f_2$. Clock $\phi_1$ is connected to the gate electrodes of transistor switches $S_1$ and $S_4$ and clock $\phi_2$ is connected to the gate electrodes of transistors $S_2$ and $S_3$.

When clock $\phi_2$ is produced, switches $S_1$ and $S_4$ are turned on and switches $S_2$ and $S_3$ remain off. The first terminal of capacitor $C_I$ is coupled to the voltage reference $V_{REF}$ and the second terminal is connected to ground. Accordingly, capacitor $C_I$ will become charged by the reference voltage $V_{REF}$.

When clock $\phi_1$ is produced, switches $S_2$ and $S_3$ are turned on and switches $S_1$ and $S_4$ are turned off. Accordingly, the first terminal of capacitor $C_I$ is disconnected form the reference voltage $V_{REF}$ and is connected to ground. Similarly, the second terminal is disconnected from ground and connected to the inverting input of amplifier 32. This causes the charge on capacitor $C_I$ to be transferred so as to result in a current flow away from the inverting input of amplifier 32.

The output of the SC amplifier 20 on line 28 is connected to the negative input of a comparator circuit 34. The positive input of comparator 34 is connected to line 24 which carries voltage reference $V_{REF}$. The output of comparator 34 is connected to an inverting amplifier stage which includes a P-channel transistor 36 and an N-channel transistor 38. The gate electrodes of transistors 36 and 38 are connected in common to the output of comparator 34.

The output of the amplifier stage is connected to one terminal of a capacitor 40, with the second capacitor terminal being connected to ground. The amplifier stage output produces the control voltage $V_c$ on line 26 which is fed back to the gate electrode of transistor M and which is used to tune the continuous-time filter (not depicted).

The SC amplifier 20 has a voltage gain $A_v$ equal to the ratio of the amplifier 32 feedback impedance over the input impedance to the amplifier. The feedback impedance is the small signal resistance of transistor M. The input impedance is the effective resistance of the switched-capacitor network which includes switches $S_1$-$S_4$ and capacitor $C_I$. As is well known, the effective resistance RSC of the switched capacitor network is as follows:

$$R_{SC} = 1/f_s C_I \quad (1)$$

where $R_{SC}$ is the effective resistance of the switched capacitor network;

$f_s$ is the sampling clock frequency; and $C_I$ is the capacitance of capacitor $C_I$.

Accordingly, the voltage gain $A_v$ of the SC amplifier 20 is as follows:

$$A_v = Z_F/Z_I \quad (2)$$

or $$A_v = f_s C_I R_{On} \quad (3)$$

where $A_v$ is the closed loop voltage gain of the SC amplifier;

$Z_F$ is the feedback impedance;

$Z_I$ is the input impedance;

$f_s$ is the sampling clock frequency;

$R_{ON}$ is the small signal resistance of transistor M; and $C_I$ is the capacitance and value of capacitor $C_I$.

The comparator circuit 30 compares the output voltage of the SC amplifier with voltage $V_{REF}$. If the amplifier output voltage exceeds $V_{REF}$, the comparator circuit output goes to a low voltage level. Conversely, if the amplifier output is less than voltage $V_{REF}$, the comparator output goes to a high voltage level.

The amplifier stage comprising transistors 36 and 38 together with capacitor 40 function as a filter with a relatively large time constant. When the output of comparator 37 is low, transistor 38 is turned off and transistor 36 is turned on. Transistor 36 functions as a current source which charges capacitor 40. When the comparator 34 output is high, transistor 36 is off and transistor 38 is on and functions as a current source which discharges capacitor 40. This action causes the control voltage $V_c$ across the capacitor 40 to stabilize to a D.C. value.

The control voltage $V_c$ is connected to the gate electrode of transistor M. Accordingly, the value of the small signal resistance $R_{ON}$ of transistor M will vary with changes in voltage $V_c$, as will the voltage gain $A_V$.

If the output of SC amplifier 20 on line 28 is greater than $V_{REF}$, the voltage gain $A_V$ of the amplifier exceeds unity. The output of comparator 34 will go negative, thereby causing control voltage $V_c$ to increase which will tend to turn on transistor M, thereby reducing the value of $R_{ON}$. As can be seen by equation (3), the reduced value of $R_{ON}$ will decrease the voltage gain thereby reducing the SC amplifier output voltage.

In the event the output of amplifier 20 is less than voltage $V_{REF}$, the gain of the amplifier is less than unity. The comparator 34 output will switch to a high level, thereby causing the control voltage $V_c$ to decrease. The drop in voltage $V_c$ will tend to turn off transistor M, thereby increasing the gain of SC amplifier 20. Thus, the gain of amplifier 20 will return to unity and the amplifier output voltage will approach voltage $V_{REF}$.

Once the feedback loop reaches steady-state, control voltage $V_c$ maintains the voltage gain $A_V$ of SC amplifier 20 at unity. Accordingly, equation (3) shows that the value of time constant of amplifier 30 will be as follows:

$$R_{ON} \times C_I = 1/f_s \quad (4)$$

In the event $R_{ON}$ or $C_I$ changes value due to temperature, process variations or aging, the gain of SC amplifier 20 will momentarily vary from unity, but will be returned to unity by virtue of the feedback action of control voltage $V_c$. Transistor M is designed with a geometry with the same ratio of width to length as the transistors 16 (FIG. 1) in the associated continuous-time filter. Similarly, capacitor $C_I$ is fabricated to match the capacitor 14 (FIG. 1) of the associated filter.

To ensure that transistor M is operating in the desired resistance (triode) region, the reference voltage $V_{REF}$ should be made small, depending on the threshold voltage of the device. Typically, the value of $V_{REF}$ is slightly less than one volt.

Tuning is accomplished by changing the frequency $f_s$ of the clock of line 22. This will cause the effective resistance of the switched-capacitor network to change in accordance with equation (1). Control voltage $V_c$ will then change so as to force the small signal resistance $R_{on}$ of transistor M to match the new effective resistance of the switched-capacitor network. The change in control voltage $V_c$ will also change the frequency response characteristics of the continuous-time filter 12, as desired.

Capacitor $C_{FB}$ is a holding capacitor which holds the output of amplifier 32 when switched-capacitor $C_I$ s recharging. The holding capacitor $C_{FB}$ can be eliminated by utilizing the alternative switched-capacitor input network shown in FIG. 3.

Figure 3:
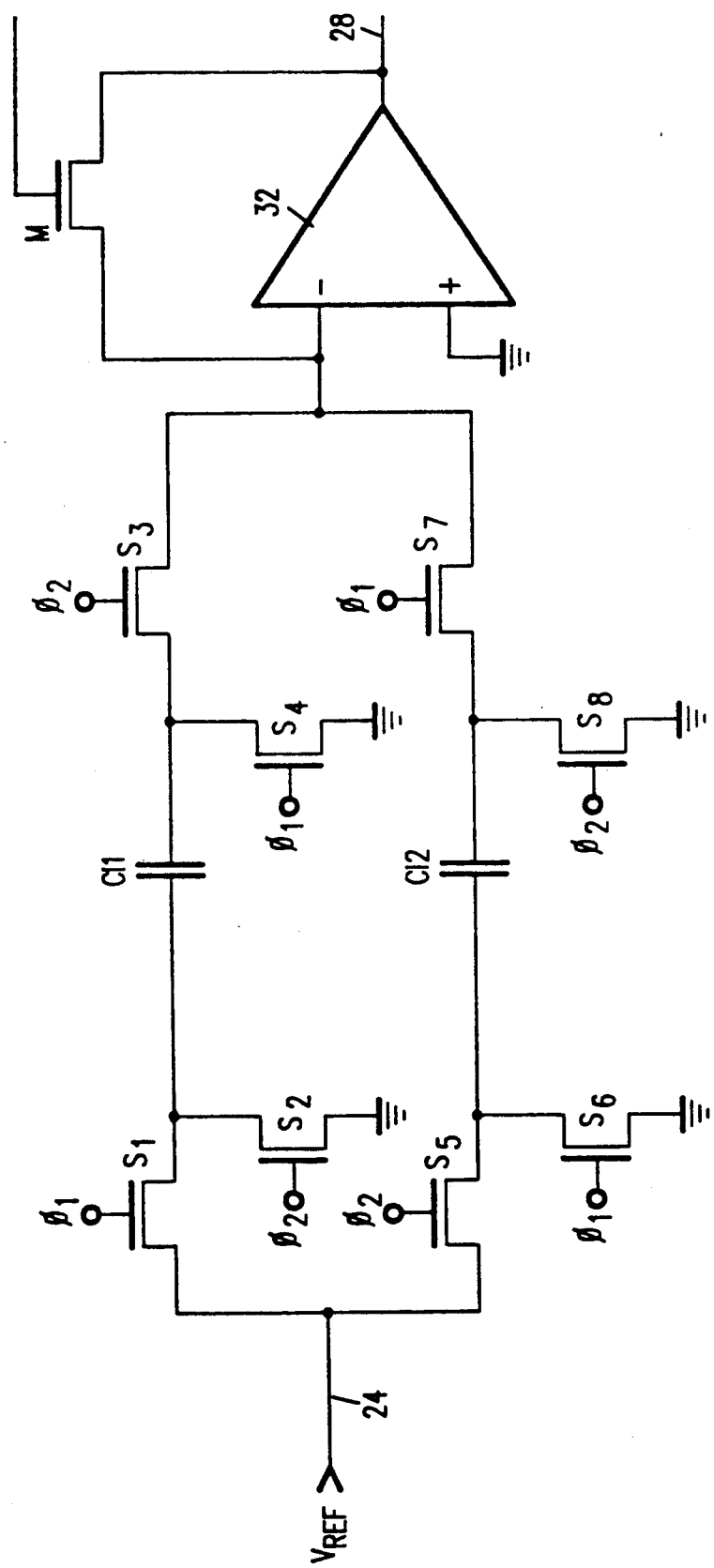
FIG. 3 is an alternative switched-capacitor network for the FIG. 2 tuning circuit.

The FIG. 3 circuit input network includes two identical capacitors $C_{I1}$ and $C_{I2}$ which are controlled by switches $S_1$ through $S_8$. Switches $S_1$ and $S_4$ are controlled by clock $\phi_1$ and switch $S_2$ and $S_3$ are controlled by clock $\phi_2$. Similarly, switches $S_6$ and $S_7$ are controlled by clock $\phi_1$ and switches $S_5$ and $S_8$ and controlled by clock $\phi_2$.

During one phase of the clock, capacitor $C_{f1}$ has one terminal grounded through switch $S_4$ and the other terminal connected to the reference voltage $V_{REF}$ by way of switch $S_1$. Thus, capacitor $C_{f1}$ is charged during this phase of the clock. During the same phase, capacitor $C_{f2}$ has one terminal connected to ground by switch $S_4$ and the other terminal connected to the inverting input of amplifier 32 through switch $S_7$. Thus, charge is transferred from capacitor $C_{f2}$ during this period.

During the next clock phase, the charge on capacitor $C_{f1}$ is transferred to amplifier 32 and capacitor $C_{f2}$ is being charged. Thus, during each clock phase, either capacitor $C_{f1}$ or $C_{f2}$ is transferring charge, thereby eliminating the need for a holding capacitor. The effective resistance of the alternative input network is as follows:

$$R_{SC} = \frac{1}{2f_s C} \qquad (5)$$

where $R_{SC}$ is the effective resistance;

$f_s$ is the clock frequency; and

C is the capacitance of capacitors $C_{f1}$ and $C_{f2}$.

Unity gain is achieved by controlling the gate voltage of transistor M such that the small signal resistance of the transistor is equal to $1/2f_s C$.

Thus, a tuning circuit for use with a monolithic integrated circuit continuous-time filter has disclosed. Although the tuning circuit has been described in some detail, it is to be understood that charges can be made to the circuit without departing from the spirit and scope of the invention as defined by the appended claims.

What is claimed is:

1. A tuning circuit for producing a control signal for a filter in response to a tuning circuit input signal, with the tuning circuit and filter being implemented in a common monolithic integrated circuit and the filter including at least one transistor and one capacitor, said tuning circuit comprising:

first resistance means for producing an effective first resistance in response to the tuning circuit input signal and which is a function of a capacitor located in the monolithic integrated circuit;

second resistance means for producing an effective second resistance which is a function of the resistance of a transistor located in the monolithic integrated circuit means; and control means for producing the control signal as a function of the ratio of the first and second resistances, whereby the control signal will vary with changes in the tuning circuit capacitor and transistor.

2. The tuning circuit of claim 1 wherein the first resistance means includes a switched-capacitor network and the tuning circuit input signal is a clock signal which clocks the switched-capacitor network.

3. The tuning circuit of claim 2 wherein the control means includes an amplifier having an input coupled to the first resistance means.

4. The tuning circuit of claim 3 wherein the second resistance means provides feedback for the amplifier.

5. The tuning circuit of claim 4 wherein the transistor of the second resistance means is an MOS transistor having source and drain electrodes which define a feedback path connecting an amplifier output to an amplifier input so as to form a closed loop amplifier and a gate electrode coupled to a potential which varies with the control signal.

6. The tuning circuit of claim 5 wherein the ratio of the first and second resistances determine the gain of the closed loop amplifier.

7. The tuning circuit of claim 6 wherein the control means includes gain means for producing the amplifier gain.

8. The tuning circuit of claim 7 wherein the gain means includes a comparator circuit having a first input coupled to the amplifier output.

9. The tuning circuit of claim 8 including means for receiving a reference voltage and for coupling the reference voltage to the switched-capacitor network and to a second input of the comparator means.

10. The tuning circuit of claim 9 wherein the MOS transistor includes a gate electrode coupled to the control signal so that the closed loop gain varies with changes in the control signal.

11. The tuning circuit of claim 11 wherein the capacitor of the first resistance means and the transistor of the second resistance means match the capacitor and transistor of the filter.

12. A tuning circuit for producing a control signal for a filter in response to a tuning circuit input signal, with the tuning circuit and filter being implemented in a common monolithic integrated circuit and the filter including at least one transistor and one capacitor, said tuning circuit comprising:

a switched-capacitor-network switched by the tuning circuit input signal and having at least one capacitor which matches the filter capacitor, with the network having an effective resistance which varies with a frequency at which the network is switched and varies with the magnitude of the at least one network capacitor;

a tuning circuit transistor having an effective resistance which varies with a voltage applied to a control electrode of the tuning circuit transistor; and voltage control means for providing the control signal as a function of the relative magnitude of the switched-capacitor network effective resistance and the transistor effective resistance, with the voltage at the tuning circuit transistor control electrode being a function of the control signal.

13. The tuning circuit of claim 12 wherein the control means includes a comparator circuit having a first input coupled to a signal which is indicative of the relative magnitudes of the two effective resistances.

14. The tuning circuit of claim 13 where the switched-capacitor network receives a reference voltage for charging the network capacitor, with the voltage reference also being coupled to a second input of the comparator circuit.

15. The tuning circuit of claim 14 wherein the ratio of the magnitude of the two effective resistances is unity.

16. A method of tuning an integrated circuit filter, with the filter including at least one transistor and one capacitor, said method comprising the following steps:

producing a first effective resistance having a magnitude which varies with variations in the filter capacitor capacitance value;

producing a second effective resistance having a magnitude which varies with variations in the filter transistor resistance;

controlling relative magnitudes of the first and second effective resistances to a predetermined value; and producing a control signal in response to said relative magnitude for tuning the filter.

17. The method of claim 16 wherein the step of producing the first effective resistance is carried out utilizing a switched-capacitor network which includes a capacitor formed in the integrated circuit.

18. The method of claim 17 wherein the step of producing the second effective resistance is carried out utilizing a transistor formed in the integrated circuit.

19. The method of claim 16 wherein the capacitor and transistor utilized for producing the control signal match the capacitor and transistor, respectively, of the filter.

20. The method of claim 16 wherein the step of producing the first effective resistance is carried out utilizing a switched-capacitor network, the step of producing the second effective resistance is carried out utilizing a transistor, and the step of controlling the relative magnitudes of the first and second effective resistances is carried out by varying the conductivity of the transistor used for producing the second effective resistance.

* * * * *

UNITED STATES PATENT AND TRADEMARK OFFICE
CERTIFICATE OF CORRECTION

PATENT NO. : 5,124,593

DATED : June 23, 1992

INVENTOR(S) : Jean-Yves Michel

It is certified that error appears in the above - identified patent and that said Letters Patent is hereby corrected as shown below:

At Column 1, Line 63, after "produced on the" insert --chip which is constructed using the same type of--.

At Column 3, Line 40, delete "monolithio" and insert --monolithic--.

At Column 6, Line 63, after $C_I$, delete "s" and insert --is--.

At Column 7, Line 12, delete "$S_4$" and insert --$S_6$--.

At Column 8, Line 7, after "for producing the" insert --the control signal as a function of the closed loop--.

Signed and Sealed this

Twenty-first Day of December, 1993

Attest:

BRUCE LEHMAN

Attesting Officer     Commissioner of Patents and Trademarks